us008125843B2

United States Patent
Konda

(10) Patent No.: US 8,125,843 B2
(45) Date of Patent: Feb. 28, 2012

(54) SEMICONDUCTOR MEMORY DEVICE AND METHOD FOR TESTING THE SAME

(75) Inventor: Chikara Konda, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 340 days.

(21) Appl. No.: 12/564,183

(22) Filed: Sep. 22, 2009

(65) Prior Publication Data

US 2010/0074039 A1    Mar. 25, 2010

(30) Foreign Application Priority Data

Sep. 22, 2008  (JP) ................................. 2008-242958

(51) Int. Cl.
G11C 7/00    (2006.01)
(52) U.S. Cl. ........................................ 365/201; 365/200
(58) Field of Classification Search .................. 365/201, 365/200

See application file for complete search history.

(56) References Cited

U.S. PATENT DOCUMENTS 6,498,755 B2 * 12/2002 Takahashi et al. ....... 365/189.14
2002/0131307 A1   9/2002 Murai et al.

FOREIGN PATENT DOCUMENTS

JP    2002-269993    9/2002

* cited by examiner

Primary Examiner — Son Dinh
Assistant Examiner — Nam Nguyen
(74) Attorney, Agent, or Firm — Young & Thompson

(57) ABSTRACT

A semiconductor memory device includes a memory cell array, a data input/output terminal, a data input/output circuit, and a test circuit. The data input/output circuit is provided between the memory cell array and the data input/output terminal. The data input/output circuit includes a main amplifier that amplifies data written into selected memory cells in the memory cell array during data write operation and that amplifies data read from the selected memory cells during read operation, and a memory element provided accompanying the main amplifier in order to repair a defective memory cell in the memory cell array. The test circuit starts up in test mode, writes data into the memory element through the data input/output terminal, and read data from the memory element into the data input/output terminal regardless of access address information to the memory cell.

15 Claims, 6 Drawing Sheets

SEMICONDUCTOR MEMORY DEVICE AND METHOD FOR TESTING THE SAME

FIELD OF THE INVENTION

Reference to Related Application

This application is based upon and claims the benefit of the priority of Japanese patent application No. 2008-242958, filed on Sep. 22, 2008, the disclosure of which is incorporated herein in its entirety by reference thereto.

The present invention relates to a semiconductor memory device and method for testing the same, and particularly to a semiconductor memory device comprising a data input/output circuit that performs data input/output between a memory cell array and a data input/output terminal and a method for testing the same.

BACKGROUND OF THE INVENTION

In the development of a semiconductor integrated circuit, it is important to accurately identify causes of a circuit bug at the time of design and of a circuit malfunction due to the operating frequency at an early stage. In the recent development of semiconductor integrated circuits, it has become difficult to accurately grasp bugs and circuit malfunctions particularly due to the problems described below.

In other words, as the scale of circuits increases due to the improved performance, it is difficult to achieve accurate simulation at the time of design, the number of bugs increases, and understanding a failure is difficult due to complex malfunctions of a plurality of circuits. Further, since the operating frequency increases in order to achieve high-speed operation, the frequencies cannot be exhaustively simulated, resulting in increased bugs. Further, it is difficult to understand causes of malfunctions due to an increase in malfunctions caused by high-speed operation and to an increase in the level of analysis. Further, since circuits are optimized in order to reduce chip areas, the number of malfunctions increases due to the operation changes before and after the optimization, and complex malfunctions of a plurality of optimized blocks also increase. Furthermore, since operating power supply voltages are lowered in order to reduce power consumption, susceptibility to process, temperature, and noise increases, resulting in increased malfunctions. Further, due to the miniaturization of processes, malfunctions caused by processes (e.g., leak paths and defective cells) increase, and the increase in the level of analysis becomes an issue.

In order to solve these problems and improve the accuracy and speed of analysis/testing, various semiconductor integrated circuits comprise BIST circuits and scan circuits, provided only for performing tests. However, depending upon the scale of the circuit, a decrease in the operating speed and an increase in malfunctions may occur due to the fact that chip areas get larger and internal paths become more complex.

Patent Document 1 describes a semiconductor memory device having a redundant cell array provided in a memory cell array, and a test time is reduced by providing a data terminal specifically for the redundant cell array and performing a test on cells other than the redundant cells in parallel.

[Patent Document 1]

Japanese Patent Kokai Publication No. JP-P2002-269993A, which corresponds to US Patent Publication 2002/131307.

SUMMARY

The entire disclosures of Patent Documents are incorporated herein by reference thereto.

The problems described above in the development of semiconductor integrated circuits exist for semiconductor memory devices such as a dynamic random access memory device as well. A semiconductor memory device is constituted by a memory cell array that stores data, a main amplifier circuit that amplifies the data, and other peripheral circuits such as an input/output circuit that transfers the data. While the area of the memory cell array is reduced due to the miniaturization of processes, in order to satisfy the specifications regarding speed and functions demanded by a system, the operating speed of the main amplifier and the transfer speed are increased and the power consumption of these circuits is reduced. As a result, the problems described above occur.

Particularly, when the device is developed using a new manufacturing process, circuit malfunctions due to processes are likely to occur especially in the memory cell array and main amplifier, and it is difficult to achieve a complete operation immediately after the development. Meanwhile, the scale of the input/output circuit increases and the circuit itself gets complex due to improved function, increased operating speed, and reduced power consumption, on top of the new process, resulting in logical malfunctions and timing mismatches.

When a device is evaluated, write and read patterns are supplied by a tester, and from expected value errors during read operation, which part (the memory cell array, the main amplifier, or the input/output circuit) is causing the malfunction must be determined. At this time, various test codes are used to infer the cause. Further, if the memory cell array or the main amplifier is having a significant failure (e.g., inability to read at all, reading different data, etc.), the transfer system such as the input/output circuit cannot be evaluated, affecting the time cost.

According to an aspect of the present invention, there is provided a semiconductor memory device includes a memory cell array, a data input/output terminal, and a data input/output circuit provided between the memory cell array and the data input/output terminal. The data input/output circuit has a main amplifier that amplifies data written into selected memory cells in the memory cell array during data write operation and that amplifies data read from the selected memory cells during read operation, and a memory element provided accompanying the main amplifier in order to repair a defective memory cell in the memory cell array. The semiconductor memory device further includes a test circuit that starts up in test mode, writes data into the memory element through the data input/output terminal, and read data from the memory element into the data input/output terminal regardless of access address information to the memory cell.

According to another aspect of the present invention, there is provided a semiconductor memory device includes a memory cell array, a data input/output terminal, a main amplifier that amplifies data read from selected memory cells in the memory cell array and that amplifies data written into selected memory cells, a memory element provided accompanying the main amplifier in order to repair a defective memory cell in the memory cell array, a data input/output circuit that writes data supplied through the data input/output terminal into the memory cell array via the main amplifier during write operation, and that outputs data read from the memory cell array via the main amplifier to the data input/output terminal during read operation, and a selector circuit. The selector circuit writes data on the memory element and connects data read from the memory element instead of the memory cell array and the main amplifier to the data input/output circuit when a defective bit in the memory cell array is repaired or during a data input/output circuit test mode.

According to yet another aspect of the present invention, there is provided a semiconductor memory device test method includes providing a semiconductor memory device. The semiconductor memory device includes a memory cell array, a data input/output terminal, a data input/output circuit that serial-parallel converts data supplied through the data input/output terminal and writes the result into the memory cell array during write operation, and parallel-serial converts data read from the memory cell array and outputs the result to the data input/output terminal during read operation, and the memory element that repairs a defective bit in the memory cell array. The semiconductor memory device test method further includes testing the data input/output circuit using said memory element instead of said memory cell array regardless of the defective bit.

Meritorious effects of various aspect of the present invention are mentioned below, however, not limited thereto.

According to the present invention, the data input/output circuit of a semiconductor memory device can be tested relatively easily regardless of whether or not a memory cell array is operating.

BRIEF DESCRIPTION OF THE DRAWINGS

The above features and advantages of the present invention will be more apparent from the following description of certain preferred embodiments taken in conjunction with the accompanying drawings, in which.

PREFERRED MODES

The preferred modes of the present invention will be described using examples with reference to the drawings.

Example 1

Figure 1:
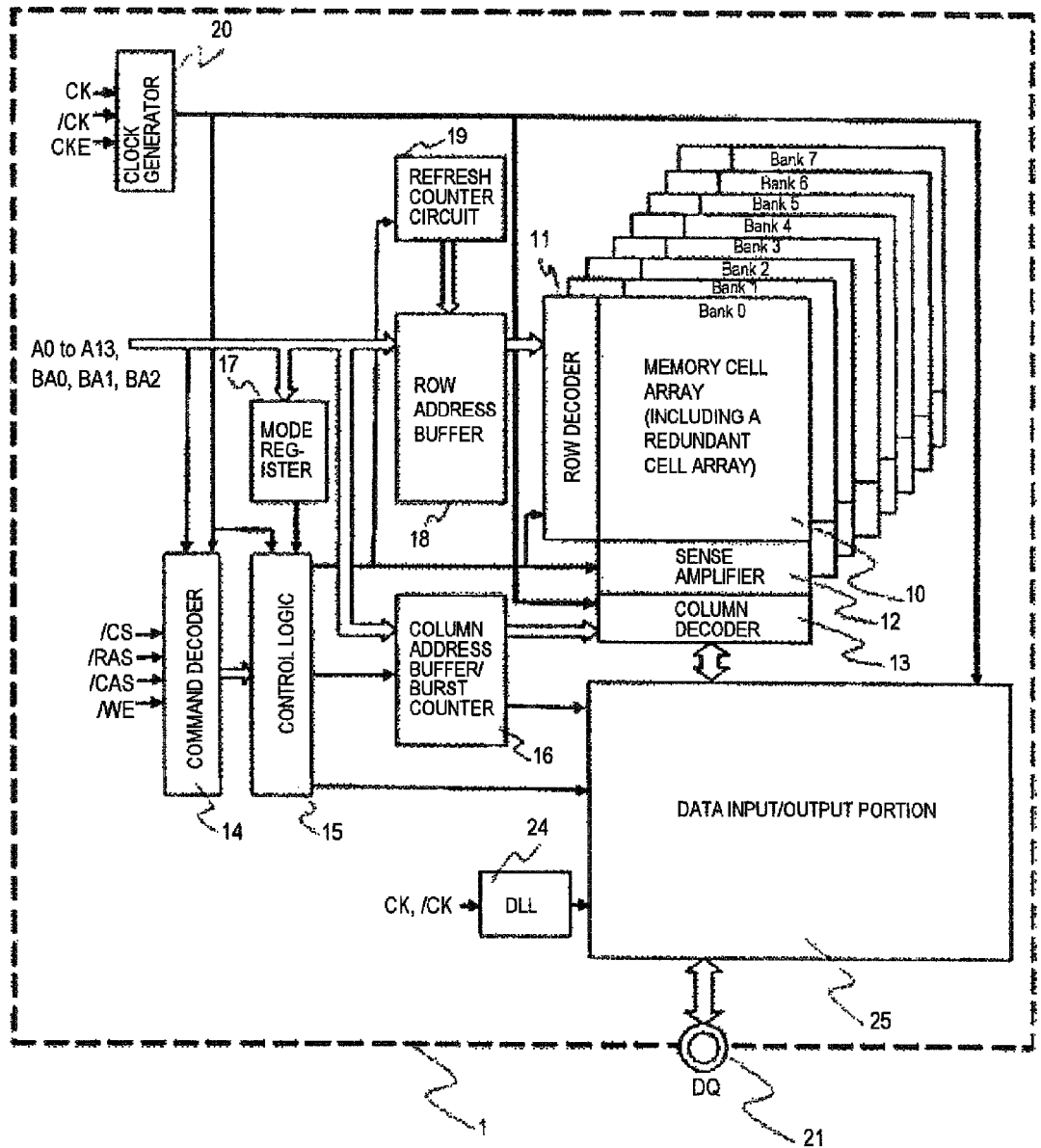
FIG. 1 is a whole block diagram of a semiconductor memory device according to an example of the present invention.

FIG. 1 is a whole block diagram of a semiconductor memory device of Example 1. In FIG. 1, the semiconductor memory device is an 8-bank DDR2 (Double Data Rate 2) SDRAM, however, it is not limited to this structure. In FIG. 1, 10 denotes a memory cell array including a redundant cell array; 11 denotes a row decoder that decodes a row address and drives a selected word line; 12 denotes a sense amplifier; 13 denotes a column decoder that decodes a column address and selects a selected bit line; 14 denotes a command decoder that receives a predetermined address signal, and a chip select/CS signal, a row address strobe/RAS signal, a column address strobe/CAS signal, and a write enable/WE signal as control signals, and that decodes a command; 15 denotes a control logic; 16 denotes a column address buffer/burst counter; 17 denotes a mode register that receives addresses A0-A13 and signals BA0, BA1, and BA2 that select a bank from the 8 banks; 18 denotes a row address buffer; 19 denotes a refresh counter circuit that receives a refresh command, counts up, and outputs a count output as a refresh address; 20 denotes a clock generator; 21 denotes a data input/output terminal (DQ terminal) that receives and outputs read/write data from/to the outside; 24 denotes a DLL (Delay Lock Loop); and 25 denotes a data input/output portion that performs data input/output between the DQ terminal and the memory cell array 10 in synchronization with a clock supplied by the DLL.

The memory cell array 10 is a block in which 1-bit data cells specified by a row address, column address, and bank address are disposed in array. Further, the memory cell array 10 includes the redundant cell array and a defect can be repaired by replacing a region that includes a faulty cell with the redundant cell array on a bit line-by-bit line and word line-by-word line basis. Further, the sense amplifier 12 amplifies cell data read to a bit line from the cell whose word line has been selected by a refresh address during refresh and writes back the result to the original cell. The clock generator 20 receives a clock signal CK, an inverted clock signal /CK, and a clock enable signal CKE, generates a clock required for internal operations, and supplies it to each part.

Figure 2:
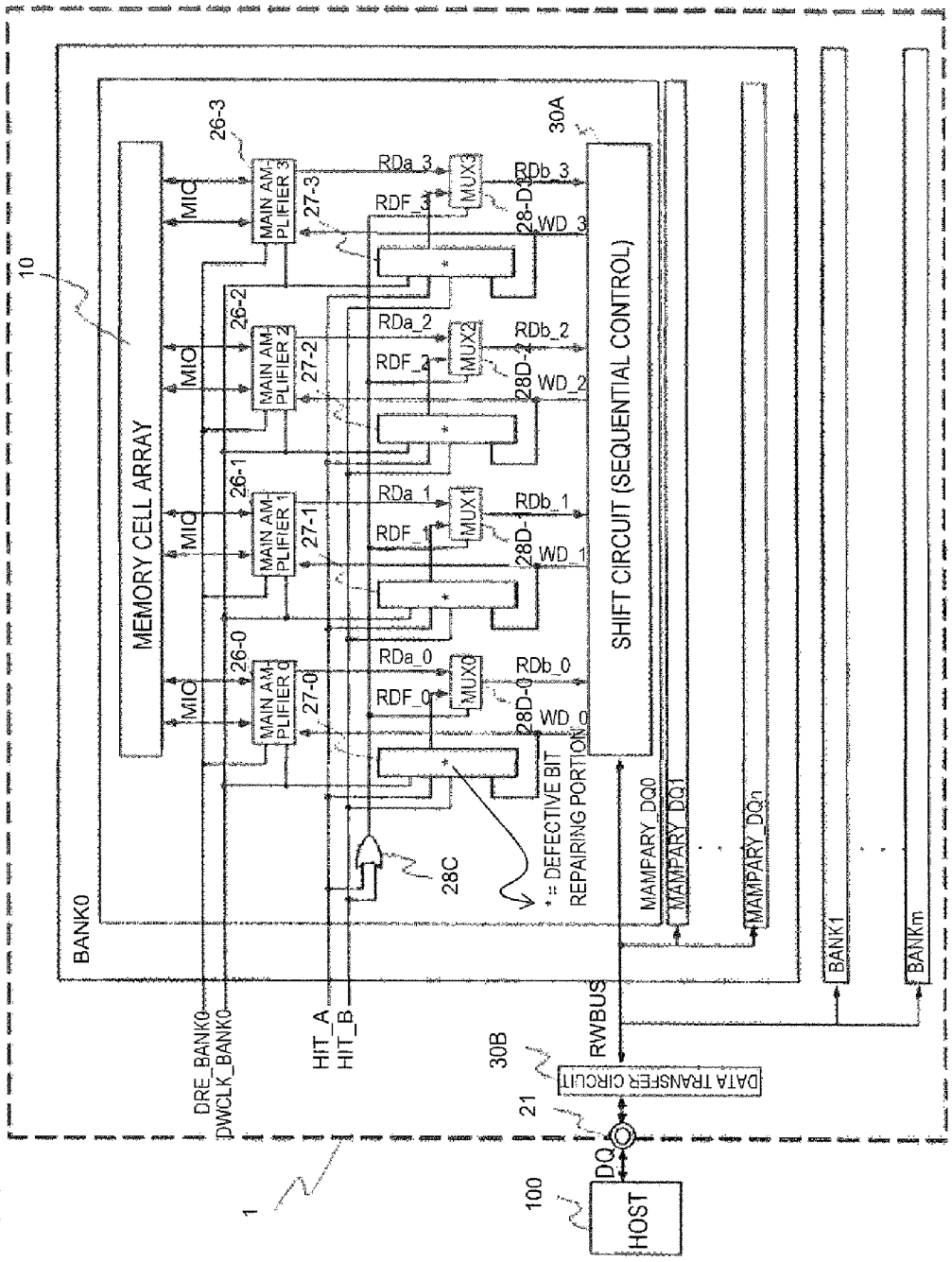
FIG. 2 is a block diagram showing a part relating to a data input/output portion of the semiconductor memory device according to an example of the present invention.

Next, the internal configuration of the data input/output portion 25 will be described. FIG. 2 is a block diagram showing a part relating to the data input/output portion 25. MAMPARY_DQ0 is a block of peripheral circuits of the memory cell array 10 and main amplifiers (26-0 to 3) to which bit 0 of a data line is connected in Bank 0. MAMPARY_DQ1 through MAMPARY_DQn are configured identically to MAMPARY_DQ0, and data lines other than bit 0 are connected to them.

The memory cell array 10 is connected to the main amplifiers 0 to 3 (26-0 to 3) by a MIO line via the sense amplifier 12 and the column decoder 13, not shown in FIG. 2.

The main amplifiers 0 to 3 (26-0 to 3) are differential amplifier circuits that treat data of 4 addresses expressed by bit 0 and bit 1 of a column address, and the main amplifiers receive the pulse of DWCLK_BANK0, amplify the data of write data lines WD_0 to WD_3, and output the result to the MIO line during write operation. During read operation, they receive an enable DRE_BANK0 signal, amplify the data of the MIO line, and output the result to read data lines RDa_0 to RDa_3.

The read data lines RDa_0 to RDa_3 are connected to read data lines RDb_0 to RDb_3 via multiplexers 0 to 3 (28D-0 to 3), and the read data lines RDb_0 to RDb_3 are further connected to a shift circuit 30A. Further, the write data lines WD_0 to WD_3 are directly connected to the shift circuit 30A. The shift circuit 30A is connected to a data transfer circuit 30B via a RWBUS. The RWBUS is a data transfer bus that connects the shift circuit 30A and the data transfer circuit 30B. The RWBUS is an n-bit bus, and the RWBUS of each bit is connected to the MAMPARY_DQ of the corresponding bit of each bank. The data transfer circuit 30B is further connected to a DQ bus, and is connected to an external host device 100 for the semiconductor memory device 1 via the data input/output terminal 21 of the semiconductor memory device 1.

It should be noted that the host device 100 and the semiconductor memory device 1 are also connected by the control signal lines (/CS, /CAS, /RAS, /WE, etc.), the address lines (A0 to A13, BA0, BA1, BA2, etc.) that specify row addresses and column addresses of the memory cell array 10, and the clock input signals (CK, /CK, CKE) shown in FIG. 1, however, these are omitted in FIG. 2.

Next, the basic operation of the data input/output portion 25 will be described. When the host device 100 writes data into the semiconductor memory device 1, the data input/output terminal 21 serially receives the written data via the DQ bus. The written data that have been serially received are reloaded by the data transfer circuit 30B on the RWBUS. The data on the RWBUS are serial-parallel converted by the shift circuit 30A and outputted to the write data lines WD_0 to WD_3. The data on the write data lines WD_0 to WD_3 are taken into the main amplifiers 0 to 3 (26-0 to 3) in synchronization with the DWCLK_BANK0 signal outputted by the command decoder 14. Note that the DWCLK_BANK0 signal and the DRE_BANK0 signal are outputted when Bank 0 is selected, and similar signals are outputted to each bank and activated when the bank that the signals access is selected. Further, since 4-bit prefetch operation is performed in this example, the four main amplifiers 0 to 3 (26-0 to 3) operate simultaneously and amplify the data in four consecutive addresses (0 to 3).

The written data amplified by the main amplifiers 0 to 3 (26-0 to 3) are written into memory cells of the memory cell array 10 via the column decoder 13 and the sense amplifier 12 (not shown in FIG. 2).

Meanwhile, when the host device 100 reads data from the memory cell array 10, read data are read out into the MIO line from the memory cell array 10 via the sense amplifier 12 and the column decoder 13 (not shown in FIG. 2) in response to a read command given by the host device. The data read into the MIO line are supplied to the main amplifiers 0 to 3 (26-0 to 3). Since the 4-bit prefetch operation is performed, 4-bit data 0 to 3 having consecutive column addresses are read from the memory cell array in parallel and amplified by the main amplifiers 0 to 3 (26-0 to 3).

The read data amplified by the main amplifiers 0 to 3 (26-0 to 3) are supplied to the shift circuit 30A in parallel via the read data lines RDa_0 to RDa_3, the multiplexers 0 to 3 (28D-0 to 3), and the read data lines RDb_0 to RDb_3. The shift circuit 30A rearrange the bits of the data supplied in parallel from the read data lines RDb_0 to RDb_3 as necessary, converts the data into serial data, and outputs the result to the RWBUS. The data transfer circuit 30B reloads the data on the RWBUS onto the DQ bus, and outputs them to the host device 100 from the data input/output terminal 21. Further, during read/write operation, the shift circuit 30A performs setting of a sequential mode, which is separately specified, and rearranges data strings according to a designation of a column address.

Figure 3:
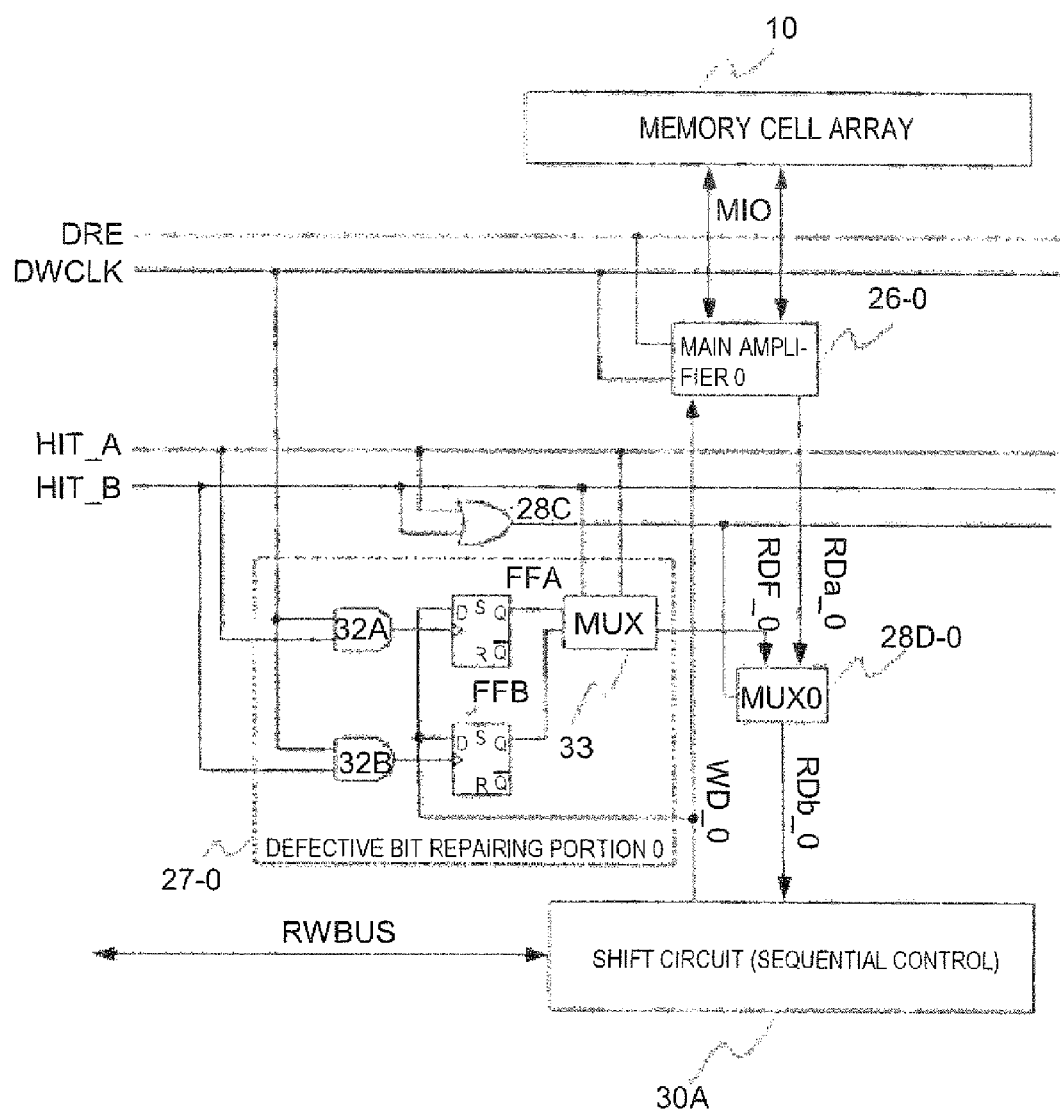
FIG. 3 is a block diagram showing an area surrounding a defective bit repairing portion 0 of the semiconductor memory device according to an example of the present invention.

Further, defective bit repairing portions 0 to 3 (27-0 to 3) are provided as circuits respectively accompanying each of the main amplifiers 0 to 3 (26-0 to 3) in FIG. 2. FIG. 3 is a block diagram showing an area surrounding the defective bit repairing portion 0 (27-0) and shows the internal circuit of the defective bit repairing portion 0 (27-0). The defective bit repairing portion 27-0 is constituted by memory elements for repairing defective bits (FFA, FFB) constituted by two AND gates 32A and 32B and set/reset flip-flops, and a multiplexer 33, and when HIT_A or HIT_B is at a high level, the defective bit repairing portion 27-0 holds the data on the write data line WD_0 in the memory element FFA or FFB for repairing defective bits at the timing of DWCLK during write operation. Further, during read operation, the data in FFA or FFB are outputted to RDF_0 according to the data of HIT_A and HIT_B. RDF_0 is fed to the multiplexer 0 (28D-0) along with the read data line RDa_0, and when either HIT_A or HIT_B is at the high level, RDF_0 is outputted to the read data line RDb_0.

Figure 4:
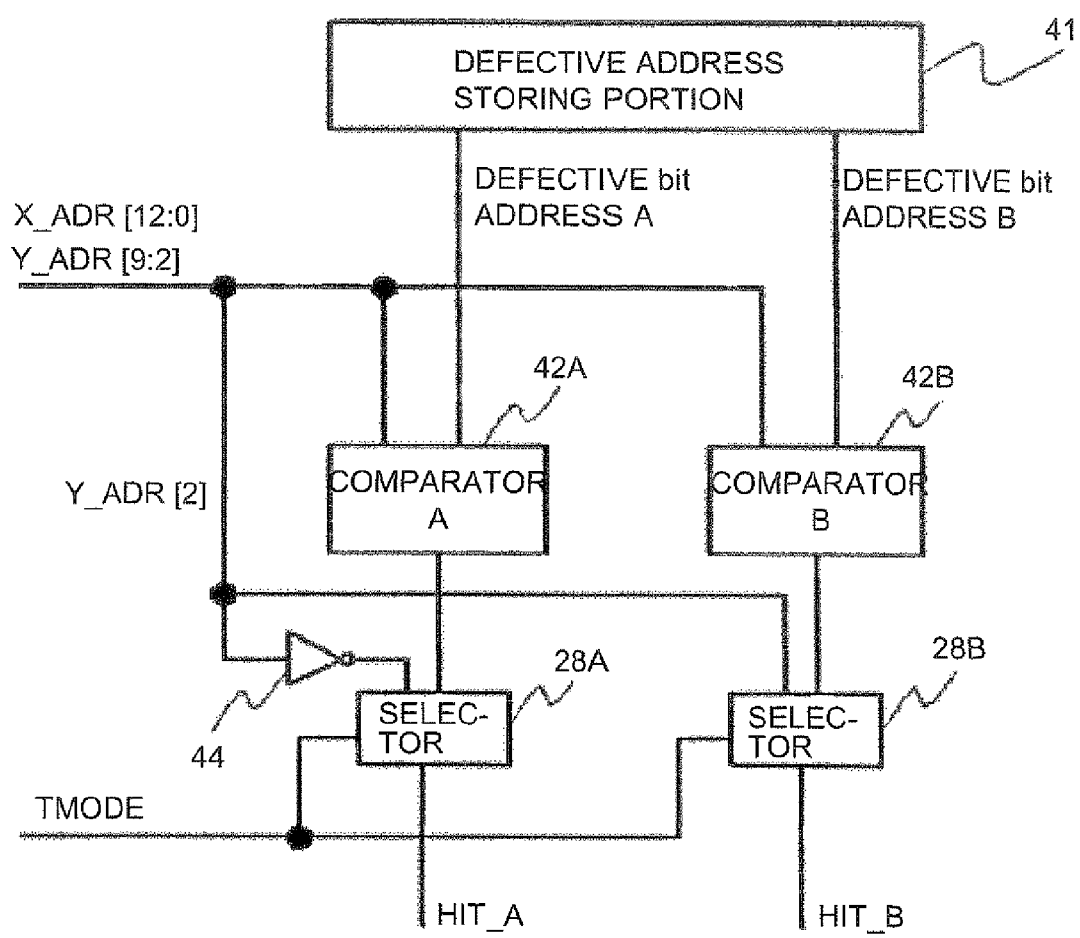
FIG. 4 is a block diagram of a defective bit repairing element selection portion of the semiconductor memory device according to an example of the present invention.

Next, FIG. 4 is a block diagram of a defective bit repairing element selection portion that generates the aforementioned HIT_A and HIT_B signals. The defective bit repairing element selection portion is constituted by a defective address storing portion 41 that stores defective bit addresses, comparators A and B that compare an address supplied externally to an address stored by the defective address storing portion 41, and selectors 28A and 28B that switch the output depending on whether or not the device is in input/output test mode.

The defective address storing portion 41 detects a defective cell, on which read/write operation cannot be performed normally, during product testing and stores the address of the defective cell. The defective address storing portion 41 is constituted by a circuit such as a flash memory device or an antifuse. In the circuit in FIG. 4, a region that holds the addresses of two defective cells (defective addresses A and B) is provided, and each address has a 13-bit row address (12 to 0) and a 7-bit column address (9 to 2). Further, the defective address storing portion 41 is constantly outputting each address.

Next, the operations of the defective bit repairing element selection portion in FIG. 4 and the defective bit repairing portion in FIG. 3 in normal operation mode will be described. The two addresses (the defective bit addresses A and B) of cells in the memory cell array 10 replaced by the memory elements FFA and FFB for repairing defective bits are stored in the defective address storing portion 41 in advance. Each of the defective bit addresses A and B stores a 13-bit row address (12 to 0) and a 7-bit column address (9 to 2).

During read or write operation, the row address and the column address specified by the host device 100 are supplied via an address decoder circuit as X_ADR[12:0] (row address) and Y_ADR[9:2] (column address). At this time, the comparators A and B compare the supplied addresses and the addresses stored in the defective address storing portion 41 to see if they coincide, and when they do, it is determined that access to the defective cell has been made, and the output of the comparator A or B goes to a high level. The comparator A compares the row address and the column address to the defective bit address A in the defective address storing portion 41, and the comparator B compares the row address and the column address to the defective bit address B in the defective address storing portion 41. The comparators A and B output a low level signal when the addresses do not coincide and the high level signal when they do. The outputs of the comparators A and B are fed to the selectors 28A and 28B. During normal operation, since a test signal TMODE is at a low level, the outputs of the comparators A and B become the HIT_A and HIT_B signals as they are. In other words, when externally supplied X_ADR[12:0] (the row address) and Y_ADR[9:2] (the column address) coincide with the defective bit address A, the HIT_A signal goes to the high level, and when the externally supplied addresses coincide with the defective bit address B, the HIT_B signal goes to the high level. In other cases, the HIT_A and HIT_B signals go to a low level.

Next, with reference to FIG. 3, if the write clock signal DWCLK goes to a high level when the HIT_A or HIT_B signal is at the high level, the AND gate 32A or 32B goes to a high level and the data on the write data line WD_0 are written into the memory element FFA or FFB for repairing defective bits. In other words, the data that are supposed to be written into the memory cell array 10 are written into the memory element FFA or FFB for repairing defective bits.

Further, since an OR gate 28C outputs a high level signal when the HIT_A or HIT_B signal is at the high level during read operation, the multiplexer 28D-0 selects the data on the output signal line RDF_0 from the defective bit repairing portion 0 instead of the read data line RDa_0, and outputs the data to the read data line RDb_0. In other words, instead of the data read from the memory cell array 10 and amplified by the main amplifier 0, the data in the memory element FFA or FFB for repairing defective bits are outputted to the shift circuit 30A. The data of which bit is selected from the 2-bit memory elements FFA and FFB for repairing defective bits is determined by whether the HIT_A signal or the HIT_B signal is at the high level.

The operation described above is summarized in Table 1.

TABLE 1

| The same as defective address? | During write operation, data are stored in: | During read operation, data are read from: | Comment |
|---|---|---|---|
| No | SHIFT –> MAMP –> Cell | Cell –> MAMP –> SHIFT | Access to normal cell |
| The same as Defective address A | SHIFT –> FF_A | FF_A –> SHIFT | Defective bit repairing operation |
| The same as Defective address B | SHIFT –> FF_B | FF_B –> SHIFT | Defective bit repairing operation |

In other words, when the externally supplied address does not coincide with the defective addresses stored in the defective address storing portion 41, as explained using FIG. 2, data are written into a cell having a specified address in the memory cell array 10 from the shift circuit 30A via the main amplifiers 0 to 3 (26-0 to 3) during write operation, and data read from a cell having a specified address in the memory cell array 10 are sent to the shift circuit 30A via the main amplifiers 0 to 3 (26-0 to 3) during read operation.

On the other hand, Table 1 shows what happens when the externally supplied address coincides with the defective address A or B stored in the defective address storing portion 41. In other words, the data sent from the shift circuit 30A to the write data lines WD_0 to 3 during write operation in FIG. 2 are stored in the corresponding memory element for repairing defective bits of the defective bit repairing portions 0 to 3 (27-0 to 3). Further, during read operation, data are read from the corresponding memory element for repairing defective bits of the defective bit repairing portions 0 to 3 instead of the memory cell array 10 and the main amplifiers 0 to 3.

By the operations described above, the defective bit repairing portions 0 to 3 (27-0 to 3) are able to repair defective cells that occur randomly. This is in contrast with the way a redundant cell array included in a memory cell array repairs defective cells, defective bit lines, and defective word lines with a region including a plurality of cells as a unit and a bit line and a word line as the minimum unit.

Further, the comparators A and B shown in FIG. 4 are provided in common for each of the 4-bit defective bit repairing portions shown in FIG. 2. Since the least significant two bits Y_ADR[1:0] of a column address are not compared by the comparators A and B, access to the memory cell array and to the 4-bit main amplifiers in FIG. 2 is changed to access to the defective bit repairing portions en bloc when the comparator A or B detects coincidence.

Further, the operation from the shift circuit 30A to the host device is not influenced by whether or not the defective bit repairing elements are used. Even if the cells of the defective addresses A and B in the memory cell array 10 are defective, the host device can function as if no defective bit existed since the defective cells are repaired by the memory elements for repairing defective bits provided in the defective bit repairing portions 0 to 3.

Next, the operation during test mode will be described. In FIG. 4, the TMODE signal goes to a high level in test mode. The configuration is not limited to this, however, in this example, the TMODE signal is outputted from the command decoder 14 and becomes high level according to a test code that can be supplied externally. When the TMODE signal goes to the high level, as shown in Table 2, the selectors 28B and 28A respectively select the third least significant bit value of the column address Y_ADR[2] and a signal obtained by inverting Y_ADR[2] using an inverter 44, instead of the outputs of the comparators B and A.

TABLE 2

| Selector 28A | | Selector 28B | |
|---|---|---|---|
| Selection signal | Output | Selection signal | Output |
| TMODE = 0 | Comparator A | TMODE = 0 | Comparator B |
| TMODE = 1 | /Y_ADR[2] | TMODE = 1 | Y_ADR[2] |

In other words, when the TMODE signal goes to the high level, either the HIT_A or HIT_B signal always goes to the high level according to the value of the third least significant bit Y_ADR[2] of the column address, regardless of the results of the comparison performed by the comparators A and B.

Therefore, as shown in Table 3, the data received by the shift circuit 30A are written into the memory element FFA or FFB for repairing defective bits in the defective bit repairing portion 0 in FIG. 3 according to the value of the third least significant bit Y_ADR[2] of the column address during write operation. Further, during read operation, the data in the memory element FFA or FFB for repairing defective bits, instead of the output of the main amplifier 0 (26-0), are outputted to the shift circuit 30A according to the value of Y_ADR[2].

TABLE 3

Read/write access destinations in input/output test mode

| TMODE signal | Y_ADR[2] | Written data stored in: | Read data read from: |
|---|---|---|---|
| High level | 0 | Memory element FFA | Memory element FFA |
| High level | 1 | Memory element FFB | Memory element FFB |

In other words, when the TMODE signal goes to the high level, data that are supposed to be written into the memory cell array 10 are written into the memory element FFA or FFB for repairing defective bits during write operation, regardless of whether or not there is coincidence with the defective addresses. Further, during read operation, data are read from the memory element FFA or FFB for repairing defective bits, instead of the memory cell array 10 and the main amplifier 0 (26-0), regardless of whether or not there is coincidence with the defective addresses. In both write and read operations, which memory element (FFA or FFB) for repairing defective bits is selected is determined by the value of the third least significant bit Y_ADR[2] of the column address.

Further, the operation in test mode is summarized as follows, with reference to FIG. 2. During write operation, the data sent from the shift circuit 30A to the write data lines WD_0 to 3 are stored in the memory elements for repairing defective bits of the defective bit repairing portions 0 to 3 (27-0 to 3). Further, during read operation, data are read from the memory element for repairing defective bits, instead of the memory cell array 10 and the main amplifiers 0 to 3.

Further, the operation from the shift circuit 30A to the host device is not influenced by whether or not the defective bit repairing elements are used. In test mode, by performing data read/write operation on the memory elements for repairing defective bits provided in the defective bit repairing portions 0 to 3 from the data input/output terminal 21 via the data transfer circuit 30B and the shift circuit 30A without using the memory cell array 10 and the main amplifiers 0 to 3, the input/output circuits including the shift circuit 30A and the data transfer circuit 30B can be tested.

When the TMODE signal goes to the high level, since the device enters into test mode, an attempt to access any bank address, row address, and column address in the memory cell array 10 ends up being access to the memory elements FFA and FFB for repairing defective bits. In other words, the memory cell array 10 and the main amplifiers 0 to 3 (26-0 to 3) are not used, and practically cut off. The region that can store data at this time is fixed to two burst access per bank when the burst length is 4, however, data can be freely written within this region. Further, an operation with a burst length of 8 is possible. Further, since the memory elements FFA and FFB for repairing defective bits are provided for the data line of each bank, different data can be written into each bank and simultaneous access to multiple banks is possible.

Since the rearrangement of data strings due to a difference in burst length or in sequential mode is performed by circuits in the host device 100 through the shift circuit 30A in FIG. 1, even when the TMODE signal goes to the high level and the device enters into test mode, the device operates identically to when it is in normal mode.

Figure 5:
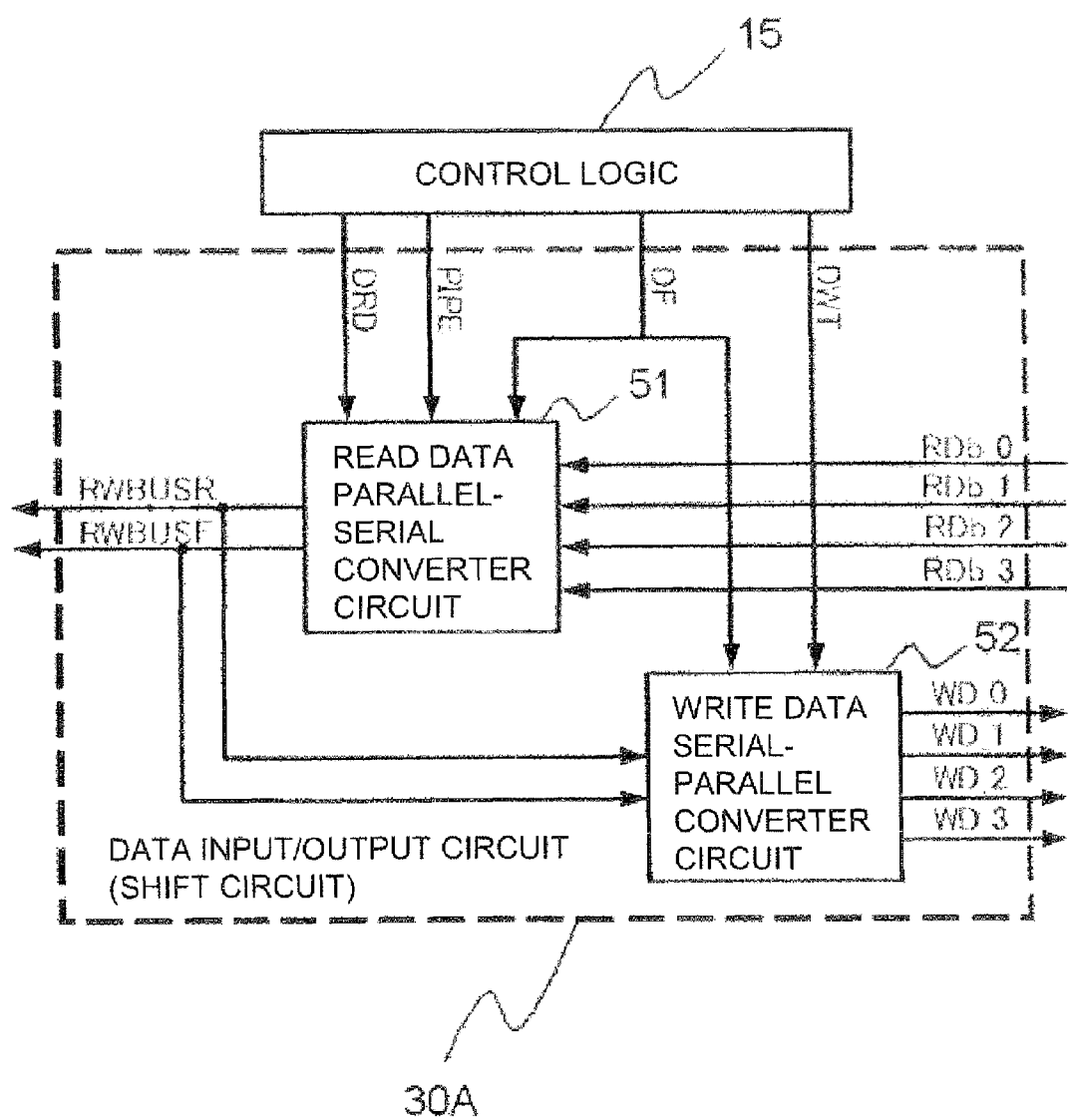
FIG. 5 is a block diagram showing a data input/output circuit (shift circuit) of the semiconductor memory device according to an example of the present invention.

FIG. 5 is a block diagram showing the internal configuration of the data input/output circuit (shift circuit) 30A. Basically, the shift circuit converts the 4-bit parallel data RDb_0 to RDb_3 outputted from the multiplexers 28D-0 to 3 into 2-bit serial data using a read data parallel-serial converter circuit 51 during read operation. Further, during write operation, the shift circuit converts 2-bit serial data outputted from the data transfer circuit 30B into the 4-bit parallel data WD_0 to WD_3 using a write data serial-parallel converter circuit 52.

RWBUSR and RWBUSF are signal lines that transfer the rise data and the fall data of the clock.

According to the least significant two bits Yadd[1:0] of the column address and the setting of the sequential mode of a mode set register, DF determines the order in which RDb_0 to RDb_3 are sent out to RWBUSR and RWBUSF during read operation, and allocates the signals of RWBUSR and RWBUSF to WD_0 through WD_3 during write operation in a control logic 15.

DRD, PIPE, and DWT are signals that determine the timing at which data are sent out, and the timing is controlled by the control logic 15 based on the setting of a command.

Figure 6:
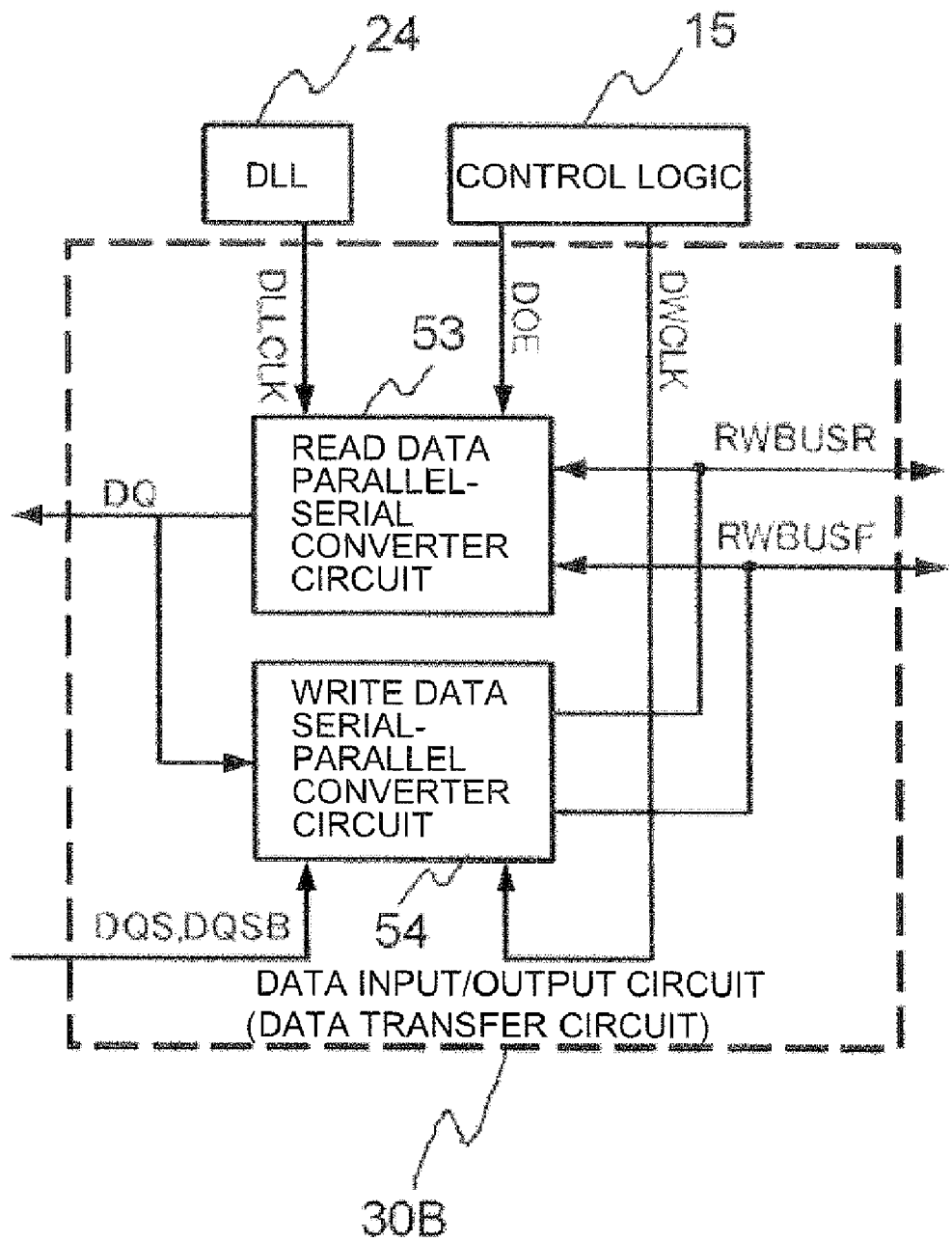
FIG. 6 is a block diagram showing a data input/output circuit (data transfer circuit) of the semiconductor memory device according to an example of the present invention.

FIG. 6 is a block diagram showing the internal configuration of the data input/output circuit (data transfer circuit) 30B. FIG. 6 shows the data input/output circuit (data transfer circuit) connected to one DQ terminal while there are n DQ terminals, not counting the DLL circuit 24 and the control logic 15. In reality, the data input/output circuit 30B is provided for each of the n DQ terminals.

During read operation, the data input/output circuit (data transfer circuit) 30B converts 2-bit parallel signals of RWBUSR and RWBUSF into a 1-bit serial signal outputted from the DQ terminal, and outputs the signal in synchronization with the DLL clock. During write operation, the data input/output circuit (data transfer circuit) 30B takes in data supplied externally from the DQ terminal at the timing of DQS and DQSB, and converts the data into 2-bit parallel signals.

DOE and DWCLK are generated by the control logic 15 according to the setting of a command and adjust the operation timing.

In Example 1 described above, the number of the defective bit repairing elements provided for the data line of each bank is two, however, this can be increased as necessary. In this case, the number of the selectors 28A and 28B in FIG. 4 and the number of the Y_ADR lines used when the selectors make selection are increased, and so is the number of the output HIT signals. Further, the 4-bit prefetch operation is performed in Example 1, however, when the number of prefetches is 8 bit or more, this can be accommodated by increasing the number of the defective bit repairing elements and the bit number of Y_ADR fed to the selectors 28A and 28B.

As described, for instance, as shown in FIG. 2, the semiconductor memory device 1 in a mode of the present invention comprises the memory cell array 10, the data input/output terminal 21, and the data input/output circuit provided between the memory cell array 10 and the data input/output terminal; the data input/output circuit has the main amplifiers 26-0 to 3 that amplify data written into selected memory cells in the memory cell array 10 during data write operation and that amplify data read from the selected memory cells during data read operation, and the memory elements (for instance FFA and FFB in FIG. 3) provided accompanying the main amplifiers 26-0 to 3 in order to repair defective memory cells in the memory cell array 10; and since the semiconductor memory device 1 comprises the test circuit that starts up in test mode, writes data on the memory elements (FFA, FFB) through the data input/output terminal 21, and reads data from the memory elements (FFA, FFB) into the data input/output terminal 21 regardless of access address information to memory cells, the data input/output circuit of the semiconductor memory device can be tested relatively easily regardless of whether or not the memory cell array is operating.

Further, as shown in FIG. 2, since the semiconductor memory device in a mode of the present invention has the memory cell array 10, the data input/output terminal 21, the main amplifiers (26-0 to 3) that amplify data read from selected cells in the memory cell array 10 and that amplify data written into the selected memory cells, the memory elements (FFA and FFB in FIG. 3) provided accompanying the main amplifiers (26-0 to 3) in order to repair defective memory cells in the memory cell array 10, the data input/output circuits (30A, 30B) that write data supplied from the data input/output terminal 21 into the memory cell array 10 via the main amplifiers (26-0 to 3) during write operation and that output data read from the memory cell array 10 via the main amplifiers (26-0 to 3) to the data input/output terminal 21 during read operation, the selector circuits (28C, 28D-0 to 3, 28A and 28D in FIG. 4) that write data on the memory elements (FFA and FFB in FIG. 3) and that connect data read from the memory elements (FFA and FFB in FIG. 3) instead of the memory cell array 10 and the main amplifiers (26-0 to 3) to the data input/output circuits (30A, 30B) when a defective bit in the memory cell array 10 is repaired or during a data input/output circuit test mode, the data input/output circuits of the semiconductor memory device can be tested relatively easily regardless of whether or not the memory cell array is operating. Therefore, test for the input/output circuit carries out in advance regardless whether or not the memory cell array is operating, then test for the memory cell array through the input/output circuit may carry out.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor memory device comprising:
   a memory cell array;
   a data input/output terminal;
   a data input/output circuit provided between said memory cell array and said data input/output terminal, said data input/output circuit comprising a main amplifier that amplifies data written into selected memory cells in said memory cell array during data write operation and that amplifies data read from said selected memory cells during read operation, and a memory element provided accompanying said main amplifier in order to repair a defective memory cell in said memory cell array; and
   a test circuit that starts up in test mode, writes data into said memory element through said data input/output terminal, and read data from said memory element into said data input/output terminal regardless of access address information to said memory cell.

2. The semiconductor memory device as defined in claim 1, wherein said memory cell array comprises a plurality of regular memory cells and a plurality of redundant memory cells, and either said regular memory cells or redundant memory cells are designated as said selected memory cells in response to the access address information to said memory cell.

3. The semiconductor memory device as defined in claim 1, wherein data are written/read into/from said memory element instead of said selected memory cells in normal operation mode.

4. The semiconductor memory device as defined in claim 1, wherein a sense amplifier and a column switch are provided between said memory cell array and said data input/output circuit.

5. The semiconductor memory device as defined in claim 1, wherein said data input/output circuit serial-parallel converts data supplied through said data input/output terminal and outputs the result to said memory cell array, and parallel-serial converts data supplied from said memory cell array and outputs the result to said data input/output terminal.

6. The semiconductor memory device as defined in claim 1, wherein said memory element is a sequential circuit.

7. The semiconductor memory device as defined in claim 1, wherein said memory element is a flip-flop circuit.

8. A semiconductor memory device comprising:
   a memory cell array;
   a data input/output terminal;
   a main amplifier that amplifies data read from selected memory cells in said memory cell array and that amplifies data written into selected memory cells;
   a memory element provided accompanying said main amplifier in order to repair a defective memory cell in said memory cell array;
   a data input/output circuit that writes data supplied through said data input/output terminal into the memory cell array via said main amplifier during write operation, and that outputs data read from said memory cell array via said main amplifier to said data input/output terminal during read operation; and
   a selector circuit that writes data on said memory element, and that connects data read from said memory element instead of said memory cell array and said main amplifier to said data input/output circuit when a defective bit in said memory cell array is repaired or during a data input/output circuit test mode.

9. The semiconductor memory device as defined in claim 8 further comprising a defective address storing portion that stores the address of a cell in said memory cell array substituted by said memory element; wherein
   said selector circuit writes data on said memory element, and connects data read from said memory element to said data input/output circuit when an externally supplied address coincides with a substitute address stored in said defective address storing portion or during said data input/output circuit test mode, regardless of whether or not said coincidence occurs.

10. The semiconductor memory device as defined in claim 8, wherein said data input/output circuit serial-parallel converts data supplied through said data input/output terminal and outputs the result to said memory cell array, and parallel-serial converts data supplied from said memory cell array and outputs the result to said data input/output terminal.

11. The semiconductor memory device as defined in claim 8, wherein said memory element is a sequential circuit.

12. The semiconductor memory device as defined in claim 8 wherein said memory element is a flip-flop circuit.

13. A method for testing a semiconductor memory device comprising:
    providing a semiconductor memory device comprising a memory cell array, a data input/output terminal, a data input/output circuit that serial-parallel converts data supplied through said data input/output terminal and writes the result into said memory cell array during write operation, and parallel-serial converts data read from said memory cell array and outputs the result to said data input/output terminal during read operation, and a memory element that repairs a defective bit in said memory cell array; and
    testing said data input/output circuit using said memory element instead of said memory cell array regardless of said defective bit.

14. The method for testing a semiconductor memory device as defined in claim 13 wherein a plurality of said memory elements that repair a defective bit are provided so that defective bits of a plurality of different addresses can be repaired, and burst access is performed through said data input/output terminal using said plurality of memory elements that repair a defective bit, instead of burst access to said memory cell array.

15. The method for testing a semiconductor memory device as defined in claim 13, further comprising:
    testing said memory cell array after said testing said data input/output circuit.

* * * * *

UNITED STATES PATENT AND TRADEMARK OFFICE
CERTIFICATE OF CORRECTION

| | | |
|---|---|---|
| PATENT NO. | : 8,125,843 B2 | Page 1 of 1 |
| APPLICATION NO. | : 12/564183 | |
| DATED | : February 28, 2012 | |
| INVENTOR(S) | : Chikara Kondo | |

It is certified that error appears in the above-identified patent and that said Letters Patent is hereby corrected as shown below:

On the title page, item [75],

"(75) Inventor: Chikara Konda, Tokyo (JP)"

should instead read

--(75) Inventor: Chikara Kondo, Tokyo (JP)--

Signed and Sealed this
First Day of May, 2012

David J. Kappos
*Director of the United States Patent and Trademark Office*